(12) United States Patent
Brooks et al.

(10) Patent No.: US 10,794,946 B2
(45) Date of Patent: *Oct. 6, 2020

(54) TRAILER LIGHTING OUTAGE DETECTION CIRCUIT

(71) Applicant: Grote Industries, Inc., Madison, IN (US)

(72) Inventors: Timothy W. Brooks, Madison, IN (US); Eric Thorstensen, Madison, IN (US); Christopher Busse, Madison, IN (US)

(73) Assignee: Grote Industries, Inc., Madison, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/210,236

(22) Filed: Dec. 5, 2018

(65) Prior Publication Data

US 2019/0377017 A1    Dec. 12, 2019

Related U.S. Application Data

(60) Continuation of application No. 15/657,679, filed on Jul. 24, 2017, now Pat. No. 10,151,784, which is a
(Continued)

(51) Int. Cl.
*G01R 31/00* (2006.01)
*B60Q 11/00* (2006.01)
(Continued)

(52) U.S. Cl.
CPC ........... *G01R 31/006* (2013.01); *B60Q 1/305* (2013.01); *B60Q 11/005* (2013.01); *G01R 31/44* (2013.01); *H05B 45/58* (2020.01); *B60Q 2900/10* (2013.01)

(58) Field of Classification Search
CPC ..... G08B 21/185; B60Q 11/005; G01R 31/44
See application file for complete search history.

(56) References Cited

U.S. PATENT DOCUMENTS 6,525,654 B1    2/2003  Siggers
6,843,589 B1    1/2005  Dhillon et al.
(Continued)

FOREIGN PATENT DOCUMENTS

DE    39 11 896 A1    7/2002
DE    102 15 486 C1    10/2003

OTHER PUBLICATIONS

English Abstract of DE 102 15 486 C 1 obtained from Lexis-Nexis Total Patent on Jan. 2, 2019.
(Continued)

*Primary Examiner* — Hongmin Fan
(74) *Attorney, Agent, or Firm* — Woodard Emhardt Henry Reeves & Wagner LLP

(57) ABSTRACT

A vehicle LED lighting outage detection circuit is disclosed for detecting a fault in the LED light and automatically increasing the power drawn from the light power supply in response to the fault. A complementary detection circuit is also disclosed for detecting the increased power draw and signaling a fault to an operator. The increased power draw can be selected to be in the form of a pulse that settles to a lower power draw state after a time to avoid excessive and wasteful power draw. The system can be mounted in a vehicle and, more particularly, to a semi-tractor truck.

21 Claims, 10 Drawing Sheets

Related U.S. Application Data division of application No. 14/882,779, filed on Oct. 14, 2015, now Pat. No. 9,995,780.

(51) Int. Cl.
*G01R 31/44* (2020.01)
*B60Q 1/30* (2006.01)
*H05B 45/58* (2020.01)

(56) References Cited

U.S. PATENT DOCUMENTS

| | | | |
|---|---|---|---|
| 7,710,253 B1 * | 5/2010 | Fredricks | H05B 33/0884 |
| | | | 315/76 |
| 2002/0093820 A1 | 7/2002 | Pederson | |
| 2004/0104729 A1 | 6/2004 | Johansson et al. | |
| 2012/0146513 A1 * | 6/2012 | Radermacher | F21V 25/04 |
| | | | 315/119 |
| 2016/0227613 A1 | 8/2016 | Chen | |

OTHER PUBLICATIONS

English Abstract of DE 39 11 896 A1 obtained by Lexis Nexis Total Patent on Jan. 2, 2019.

* cited by examiner

TRAILER LIGHTING OUTAGE DETECTION CIRCUIT

BACKGROUND

Many automotive vehicles have systems in place which provide a warning to the operator when an exterior lamp has failed. This can be important in large tractor-trailers, where it may be difficult or impossible for the operator to visually observe that an exterior lamp on the trailer has failed. Traditional systems have been developed which detect the resulting current drop when an incandescent lamp fails (e.g., creates as an open circuit).

More modern vehicles and trailers are increasingly utilizing light emitting diodes (LEDs) as a light source. These LEDs can also fail open in similar fashion as traditional incandescent bulbs. However, a typical LED lamp uses much less current than their incandescent counterparts. Therefore, the current drop due to a failed LED is likely much less than an incandescent bulb and may not be detectable by traditional bulb outage detection systems. For example, traditional incandescent bulb outage detection systems might detect a 2.1 Amp drop in a system when a bulb fails. New LED lamps of the same function can have a drop as little as 0.15 Amps. The issue is complicated when a single tractor may need to tow trailers having either incandescent or LED lamps at different times. The issue is further complicated by the lack of a standard within the U.S. for the reporting or detection of failed lamps.

Hella KG Hueck & Co. has patented a product, shown in German Patent publication DE10215486, which is for LED turn signals. In particular, when the turn signal LEDs are not illuminated, the lamp has an imbedded microchip which actively sends a diagnostic signal through the LED, confirming that the LED is not failed open, and, therefore, presumably operational. A multiplexed signal reporting a detected failure is transmitted to the cab of the truck. This system requires paired electronic modules between the tractor and the trailer, adding complexity to the trailer lighting and harness system.

SUMMARY

Discussed herein are circuits for detecting failures in an LED lighting system. The circuits can include a load element electrically coupled between a power supply and a ground reference, a detection circuit configured and arranged to detect a failure in an LED lamp, and a power control circuit responsive to the detection circuit. The power control circuit can be configured and arranged to modify current flowing through the load element. The power control circuit can also be configured to automatically increase power dissipated by the load element when the detection circuit detects a failure in the LED lamp. The load element can optionally be a thermistor and, furthermore, a Positive Temperature Coefficient (PTC) thermistor.

The circuits can be configured to detect decreased power consumption by the LED. The decreased power consumption can be less than two hundred milliamps for a twelve volt supply voltage. The circuit can alternatively be configured to monitor the current draw of the LED lamp, a voltage across the LED lamp, a voltage in series with the lamp, or a voltage in parallel with the lamp. The outage detection circuit can be electrically in series between the LED lamp and the power supply.

The detection circuit and the LED lighting system can be housed separately or, housed in the same enclosure. The enclosure can have one or more electrical contact points configured to electrically connect with corresponding terminals mounted in a lighting socket of a vehicle. The circuit can include a socket configured to retain the LED lamp, the socket having electrical terminals configured to electrically connect to the LED; an enclosure configured to retain the LED lamp, the enclosure having electrical terminals configured to electrically connect to the LED lamp and socket terminals; with the detection circuit, power control circuit, and load element are mounted in the enclosure and the enclosure.

The circuits can be configured to detect changes after the detection of a fault in the LED lamp from a first electrical current flow rate at a first time to a second electrical current flow rate at a second time, wherein the first flow rate is greater than the second flow rate and wherein the voltage at the first time is substantially equal to the voltage at the second time. The detection circuit can include a variety of circuit methods that can further be electrically connected to a positive input of the LED lamp.

Discussed are also systems for detecting a fault in a vehicle lighting system. The systems can include a fault detection circuit configured to be electrically coupled to a power control circuit and an LED fault light, the fault detection circuit configured to detect the increased current flow caused by the power control circuit and automatically activate the LED fault light in response to the increased current flow.

The LED fault light can be mounted inside of a vehicle cabin or on the front of a trailer. If the fault detection circuit is mounted on the front of the trailer, the system does not have to be configured for a specific truck. The fault detection circuit can be configured to detect the condition where an electrical current flow changes after the detection of a fault in the LED lamp from a first electrical current flow rate at a first time to a second electrical current flow rate at a second time, wherein the first flow rate is greater than the second flow rate and wherein the voltage at the first time is substantially equal to the voltage at the second time. The fault detection circuit can optionally be configured to measure the change in voltage across a resistor.

Further forms, objects, features, aspects, benefits, advantages, and embodiments of the present invention will become apparent from the detailed description and drawings provided herewith.

DETAILED DESCRIPTION

Figure 1:
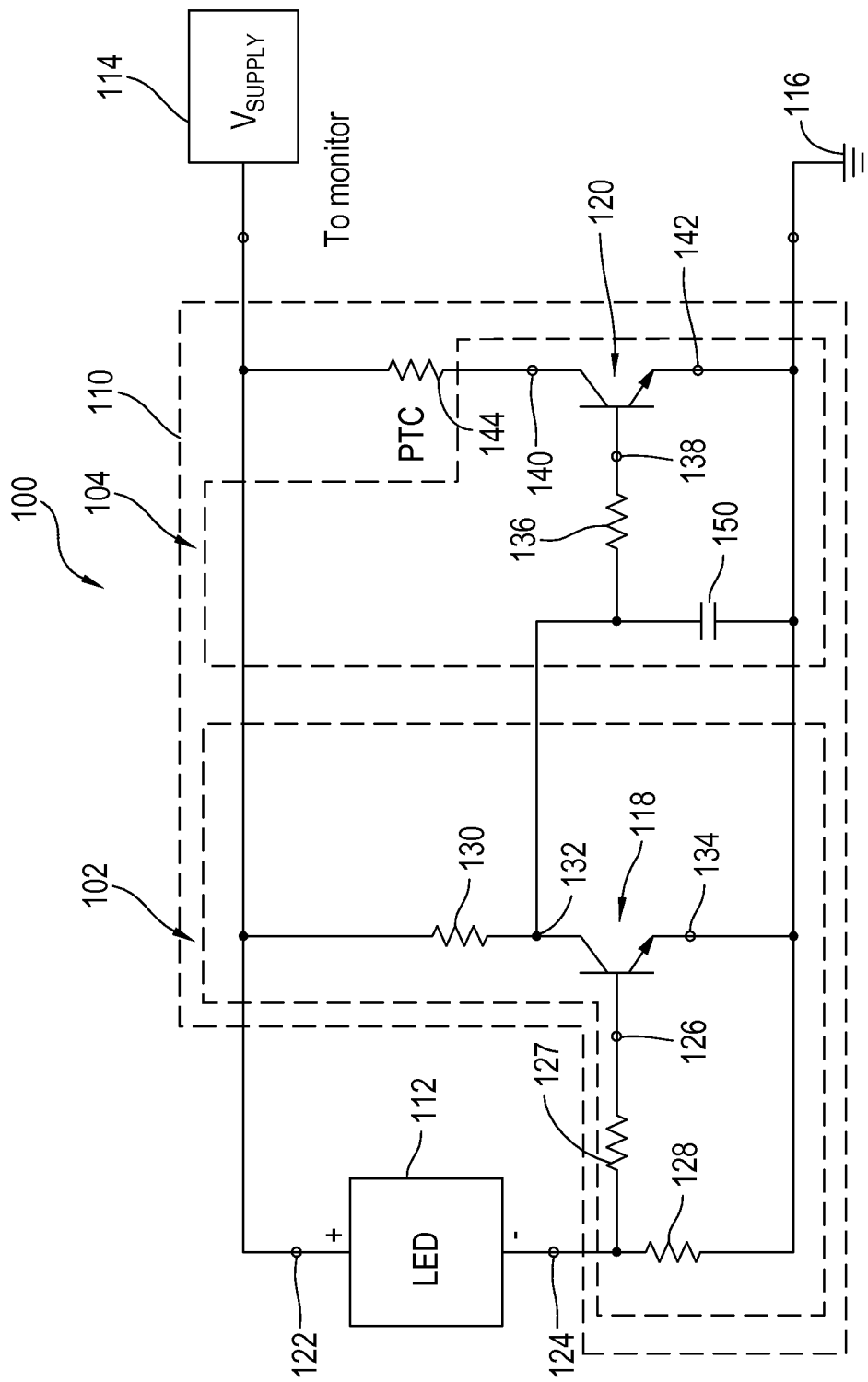
FIG. 1 is a schematic diagram of an illustrated example of an outage detection circuit for a vehicle lamp.

For the purpose of promoting an understanding of the principles of the invention, reference will now be made to the embodiments illustrated in the drawings and specific language will be used to describe the same. It may nevertheless be understood that no limitation of the scope of the invention is thereby intended. Any alterations and further modifications in the described embodiments, and any further applications of the principles of the invention as described herein are contemplated as would normally occur to one skilled in the art to which the invention relates. Certain embodiments of the invention are shown in great detail, although it may be apparent to those skilled in the relevant art that some features that are not relevant to the present invention may not be shown for the sake of clarity.

One example of a vehicle lamp outage system 100 is illustrated in FIG. 1. The system 100 includes an outage detection circuit 110 which is operatively connected between a voltage supply, such as a trailer harness and lighting system 114, and a vehicle LED 112. A trailer harness and lighting system may be characterized as a wiring and lighting system configured to distribute power to various light sources throughout the trailer. The outage detection circuit 110 can further be subdivided into two or more other circuits. As an example, a detection circuit 102 and a control circuit (also referred to as an "increase circuit") 104 are enumerated. The voltage supply 114 typically comprises a lighting circuit output from the vehicle, typically derived from a battery and/or alternator in a truck connected to the trailer. The trailer lighting system typically comprises an LED STT, turn, marker, or brake lamp (or combination of these) on the vehicle. Thus, it shall be understood that the system 100 may be duplicated for multiple lamps of a vehicle. In one embodiment, the LED 112 is located on a trailer and/or truck. The LED 112 optionally includes a power terminal 122 and ground terminal 124 as shown. The outage detection circuit 110 optionally includes switching devices 118 and 120. In the illustrated embodiment, the switching devices 118 and 120 are optionally implemented as current controlled NPN bipolar junction transistors, although other types of switching devices may be used. The outage detection circuit also optionally includes resistors 127, 128, 130 and 136, and positive temperature coefficient (PTC) thermistor 144 connected as shown. The PTC can be considered a load element in this circuit.

In the example shown in FIG. 1, the system 100 operates as follows. When the LED 112 is activated by the driver, the voltage supply 114 causes current to flow to the lamp power terminal 112. If the lamp is functioning properly, current may flow through the lamp to the ground terminal 124. From the ground terminal 124, a portion of the current may be directed through resistor 127 to a control input 126 of switching device 118. When the switching device 118 is implemented as an NPN transistor as shown, the control input 126 comprises the base of the transistor. The remaining portion of the current from terminal 124 may flow through resistor 128 to ground 116. The balance of current between resistors 126 and 128 may be set by selectively choosing the values of the resistors in order to ensure that control input of the switching device is not overloaded. With current supplied to input 126, the switching device 118 may turn on and allow current to flow from the voltage supply 114, through resistor 130, into switching input 132 (the collector of the transistor as illustrated), out the switching output 134 (the emitter of the transistor as illustrated) and to the ground 116. In the above normally operating state, minimal current may flow to the input 138 of switching device 120, since the current from resistor 130 may be shunted to ground 116 by the switching device 118. The resistor 130 may optionally be sized large enough such that only a small amount of additional current may be drawn from the supply 114 when the lamp is functioning properly. In this state, switching device 120 may be off and may allow only minimal current to flow through the load element.

However, if the LED 112 fails open, current flow to the control input 126 of switching device 118 may be interrupted. This may cause the switching device 118 to turn off, interrupting current flow from the switching input 132 to the switching output 134. As a result, current from resistor 130 may be directed to the switching input 138 of switching device 120. This may cause the switching device 120 to turn on, allowing current to flow from the supply 114, through PTC thermistor 144, into switching input 140, and out switching output 142 to ground 116. In the illustrated embodiment, the switching device 120 is implemented as an NPN bipolar transistor, the control input 138 is the base of the transistor, the switching input 140 is the collector of the transistor, and the switching output 142 is the emitter of the transistor. The PTC thermistor 144 may optionally be sized to allow a relatively high amount of additional current to be drawn from voltage supply 114. This increase in current may be detected by additional vehicle circuitry as will be later disclosed to ultimately drive a corresponding indicator device to alert the driver of the failed lamp.

When the LED 112 fails, the PTC thermistor 144 may initially draw a high amount of current from the supply 114. This high current may then be reduced as time passes. In this example, increased current can cause the resistance of the PTC thermistor 144 to increase. When this happens, the current through the PTC thermistor 144 may decrease to an equilibrium level which is lower at this later time than the initial high current draw at the earlier time. In this way, the "high current pulse" may be provided for some period of time which may trigger additional detection circuitry. As discussed, the current draw may be reduced over time to prevent unnecessary current draw through the circuit until the lamp can be repaired or replaced.

Capacitor 150 is optionally provided to prevent a false outage indication when the lamp is initially turned on or off. More specifically, on initial startup, current may begin to flow from resistor 130 to control input 138 before switching device 118 turns on. Any such current may be temporarily shorted to ground by capacitor 150 to prevent switching device 120 from turning on and triggering a false outage indication.

Other types of current regulating devices may be used in place of PTC thermistor 144. For example, a resettable fuse may be used which initially draws a high current, then switches open for a predetermined time before resetting.

Alternatively, a simple resistor could be used to draw a relatively high current from the power supply in response to a failure. A Resistor Capacitor (RC) circuit that discharges when there is a fault detected can also be used to generate a pulse. Otherwise, a switching device can be commanded to close in response to an RC circuit or other components to alter the amount of time that the switch is closed. A higher voltage can alternatively be applied in response to a failure. For example, a transformer device such as a charge pump can be used to generate the higher voltage.

Figure 2:
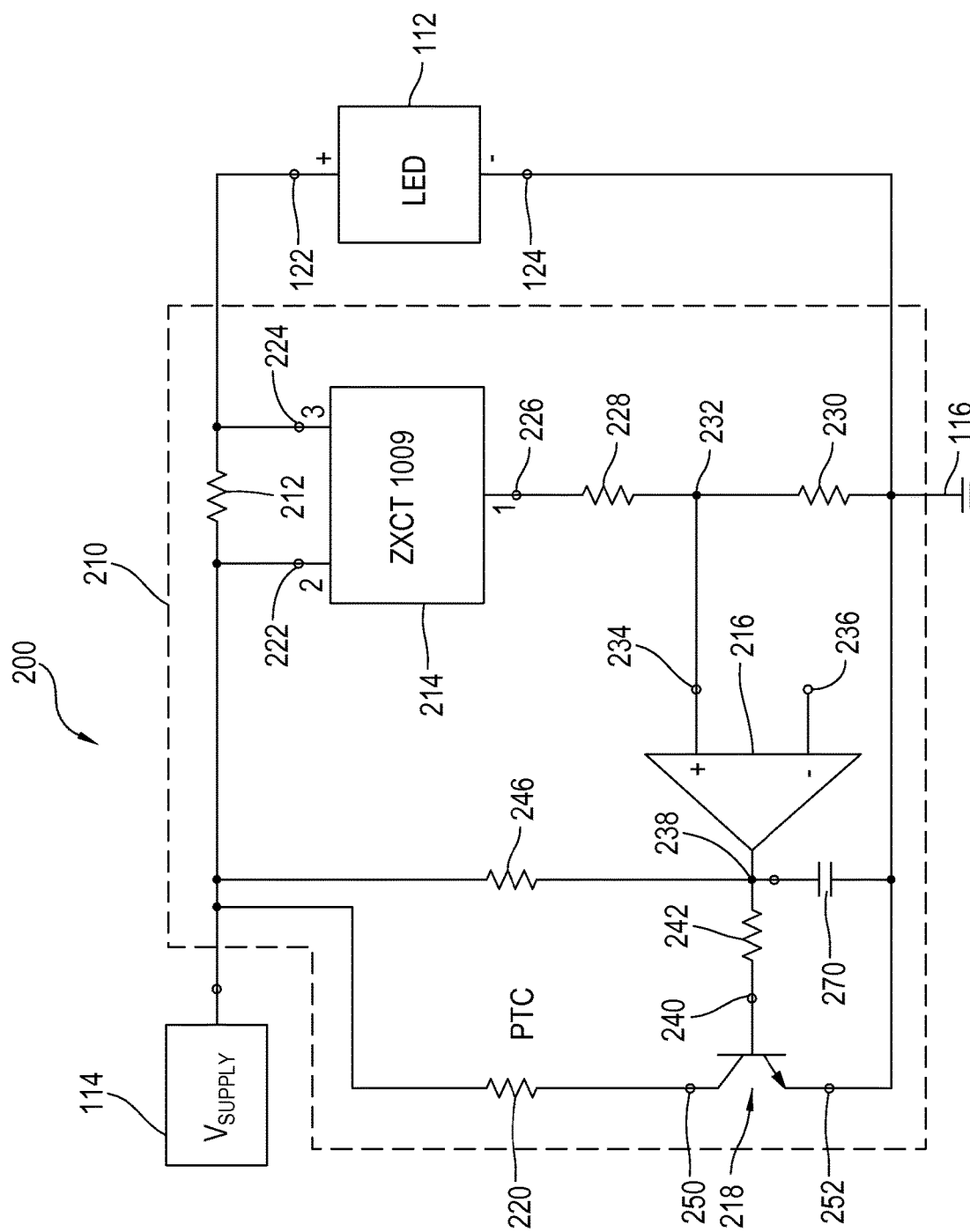
FIG. 2 is a schematic diagram illustrating another example of an outage detection circuit for a vehicle lamp like the circuit shown in FIG. 1.

FIG. 2 illustrates a system 200 which provides a similar functionality as the system 100, using different components. The system 100 includes an outage detection circuit 210 which is operatively connected between the voltage supply 114 and vehicle LED 112. As shown, the circuit 210 includes a current monitor 214 and a comparator 216. One suitable example of the current monitor 214 is the ZXCT 1009 high-side current monitor supplied by Zetex Semiconductors. In the illustrated embodiment, the current monitor 214 comprises monitor terminals 222 and 224 which are connected across a resistor 212 that may be characterized as a sense resistor. The current monitor 214 outputs a current at output terminal 226 which is proportional to the voltage across the resistor 212. When the LED 112 is functioning properly, there may be a voltage across the resistor 212 which may result in current flowing from terminal 226. Due to the connection of resistors 228 and 230 as shown, a voltage may be present at node 232 and at an input 234 of comparator 216. The resistors 228 and 230 may be selected such that the voltage at node 232 when the LED 112 is functioning properly may be greater than a reference voltage present at input 236 of comparator 216. This may prevent current from flowing into control input 240 (base) of switching device 218 (illustrated here as an NPN bipolar transistor). However, when the LED 112 fails open, the voltage across resistor 212 may be interrupted. This may also reduce the voltage at node 232, thereby allowing current to flow through point 238, resistor 242, and into control input 240. This may cause switching device 218 to turn on (with current flowing from switching input 250 (collector) to switching output 252 (emitter), to ground 116. When switching device 218 turns on, current may flow through PTC thermistor 220. In a similar fashion to system 100 above, the PTC thermistor 220 may result in an initial high current pulse, followed by a reduced current draw once the PTC thermistor reaches equilibrium. Capacitor 270 and resistor 246 are optionally provided to prevent a false outage indication when the lamp is initially turned on or off in similar fashion to capacitor 150 above.

Figure 3:
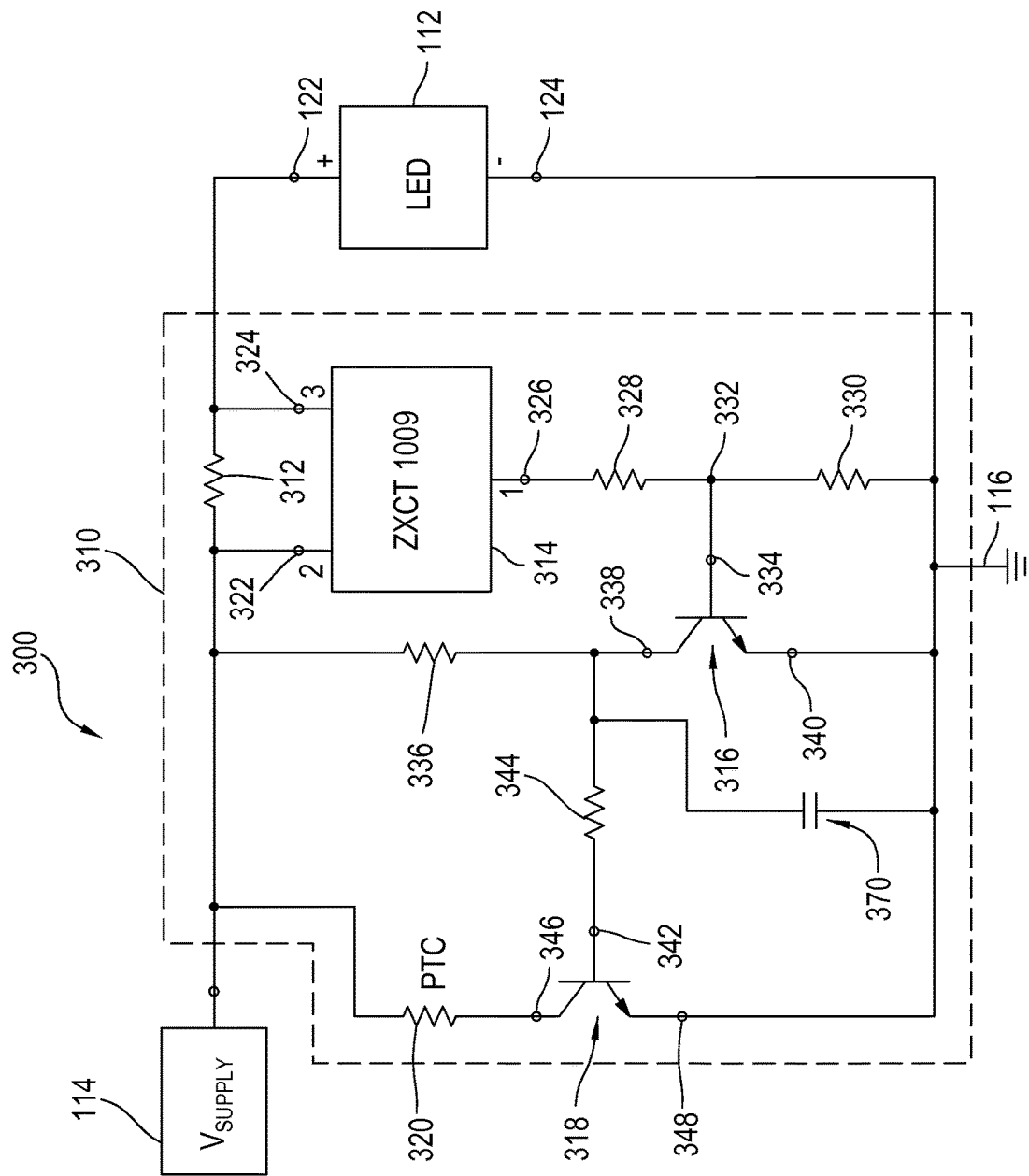
FIG. 3 is a schematic diagram illustrating another example of an outage detection circuit for a vehicle lamp like the circuit shown in FIG. 1.

FIG. 3 illustrates a system 300 according to a further embodiment configured to provide similar functionality like system 200, but which uses a transistor switching device 316 (shown here as an NPN bipolar transistor) in place of the comparator 216. The system 300 includes an outage detection circuit 310 which is operatively connected between the voltage supply 114 and vehicle LED 112. As shown, the circuit 210 optionally includes a current monitor 314 and the switching device 316. One suitable example of the current monitor 314 is the ZXCT 1009 high-side current monitor supplied by Zetex Semiconductors. In the illustrated embodiment, the current monitor 314 comprises monitor terminals 322 and 324 which are connected across resistor 312 as shown. The current monitor 314 outputs a current at output terminal 326 which is proportional to the voltage across the resistor 312. When the LED 112 is functioning properly, there may be a voltage across the resistor 312 which may result in current flowing from terminal 326. This current may flow through resistors 328 and 330 and into control input (base) of switching device 334. As a result, switching device 316 may turn on and allow current to flow from switching input 338 (collector) to switching output 340 (emitter). This may prevent current from flowing into control input 342 (base) of switching device 318. However, when the LED 112 fails open, the voltage across resistor 312 may be interrupted. This may also reduce the voltage at node 332, thereby allowing current to flow through resistor 336, and into control input 342 (via resistor 344). This may cause switching device 318 to turn on (with current flowing from switching input 346 (collector) to switching output 348 (emitter), to ground 116. When switching device 318 turns on, current may flow through PTC thermistor 320. In a similar fashion to systems 100 and 200 above, operation of PTC thermistor 320 may result in an initial high current pulse drawn from supply 114, followed by a reduced current draw once the PTC thermistor reaches equilibrium. Capacitor 370 is optionally provided to prevent a false outage indication when the lamp is initially turned on or off in similar fashion to capacitor 150 above.

Figure 4:
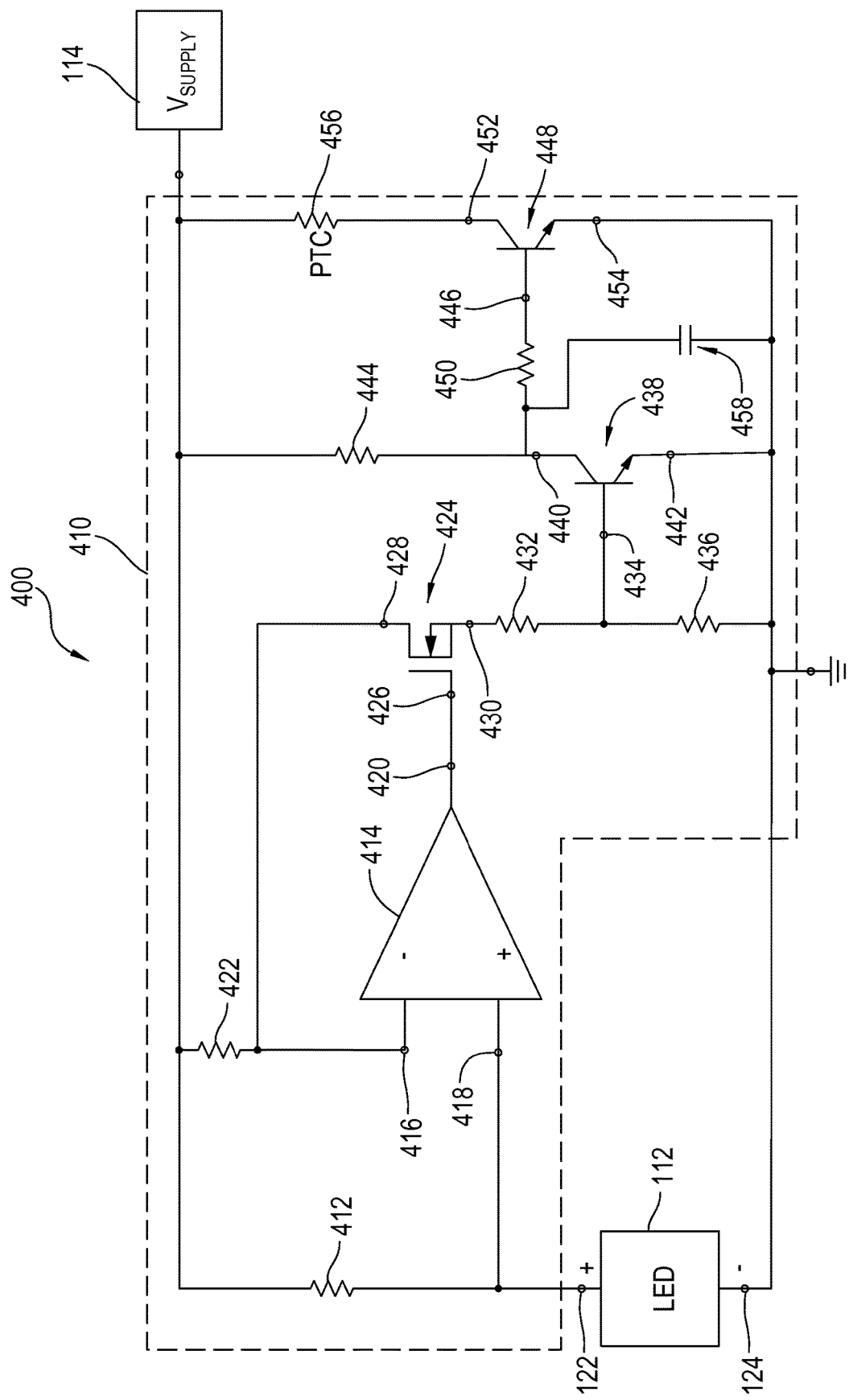
FIG. 4 is a schematic diagram illustrating another example of an outage detection circuit for a vehicle lamp like the circuit shown in FIG. 1.

FIG. 4 illustrates another example of a system like system 100, 200, and 300. System 400 provides a similar functionality using a comparator 414 and additional switching device 424. Any suitable comparator and switching device 424 may be used. For example, a comparator 414 may be an operational amplifier (or "op-amp") as illustrated. In another example, switching device illustrated at 424 may be an n-channel Metal Oxide Field Effect Transistor (MOSFET). The system 400 includes an outage detection circuit 410 which is operatively connected between the voltage supply 114 and vehicle LED 112. In the illustrated embodiment, the comparator 414 comprises a first input 416, a second input 418, and output terminal 420. The switching device 424 comprises control input 426 (gate), switching input 428 (drain) and switching output 430 (source).

When the LED 112 is functioning properly, there may be current flowing through resistor 412, resulting in a current drop across the resistor 412. The comparator may drive the linear device 424 from the control input 426, such that the voltage at the inverting input 416 may be driven about equal to the non-inverting input 418. As illustrated in FIG. 4, this result can depend on the value of resistor 422, resistor 432, resistor 436 and the switching characteristics of switching device 424 as driven by comparator 414. This results in current flow to the control input 426 which is sufficient to keep switching device 424 at least partially on to mirror the current in resistor 412. Current is therefore allowed to flow into the control input 434 (base) of switching device 438 via the resistor divider network composed of resistors 432 and 436, allowing current to flow from switching input 440 (collector) to switching output 442 (emitter) via resistor 444. This may prevent current from flowing into control input 446 (base) of switching device 448.

When LED 112 fails open, the voltage drop due to the drop in current through resistor 412 can raise the voltage at second input 418. The voltage at 418 may then be higher than the voltage at 416. The comparator 414 is configured to detect this differential and may change the output 420. This change in output at 420 may prevent current from flowing to the control input 426 of switching linear device 424, thereby turning off switching device 424 and preventing current from reaching control input 434 of switching device 438. This may cause allow current to flow from resistor 444 through resistor 450 to control input 446 of switching device 448. Switching device 448 may then turn on (with current flowing from switching input 452 (collector) to switching output 454 (emitter), to ground 116). When switching device 318 turns on, current may flow through PTC thermistor 456. In a similar fashion to system 300 above, operation of PTC thermistor 456 may result in an initial high current pulse drawn from supply 114, followed by a reduced current draw once the PTC thermistor reaches equilibrium. Capacitor 458 is optionally provided to prevent a false outage indication when the lamp is initially turned on or off in similar fashion to capacitor 150 above.

Figure 5:
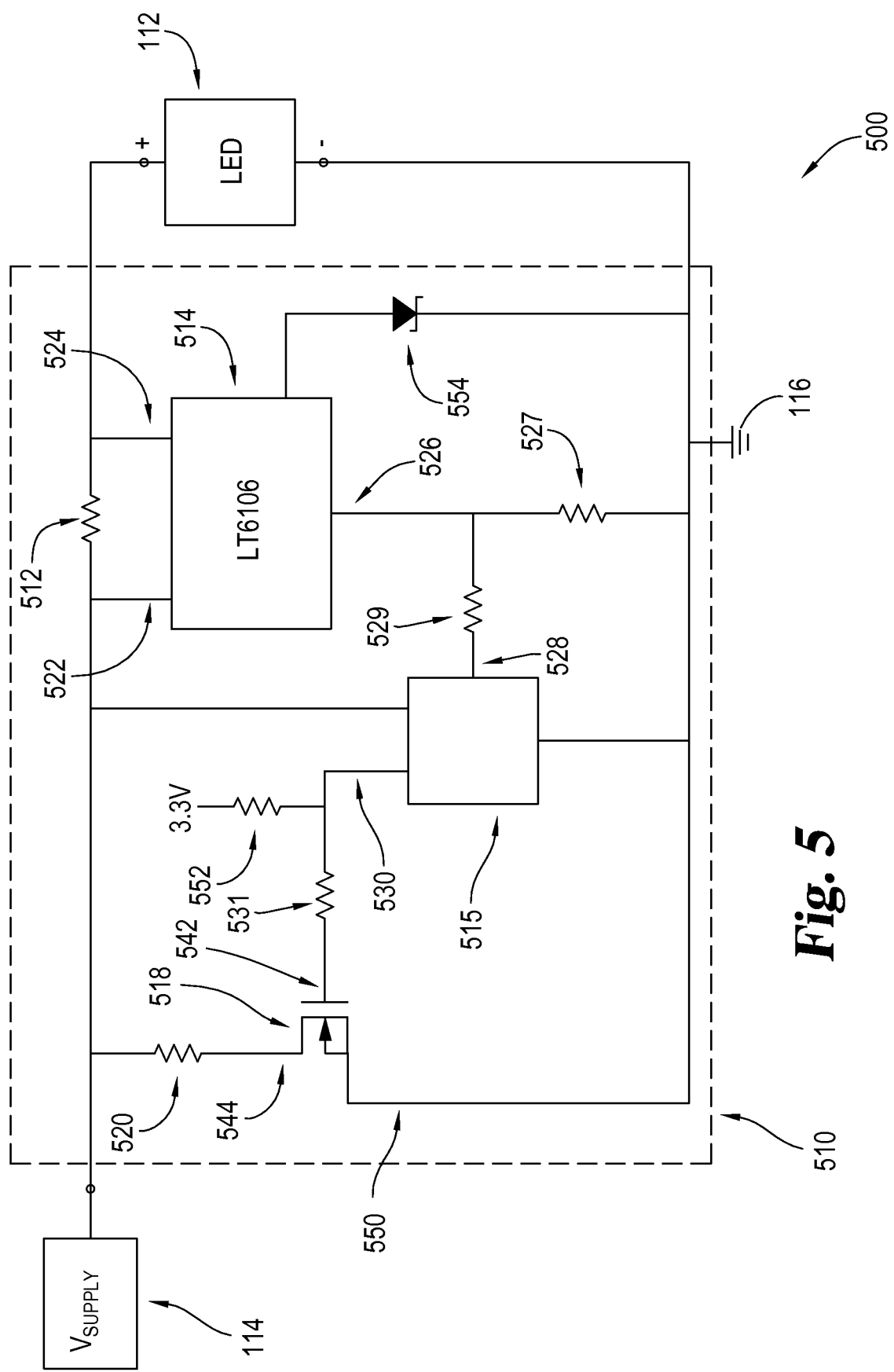
FIG. 5 is a schematic diagram an example of an outage detection circuit for a vehicle lamp according to one embodiment.

FIG. 5 illustrates a system 500 according to a further embodiment which provides a similar functionality as the above embodiments, but which uses a current monitoring device 514 and a programmable switching device 515 (illustrated here as a microprocessor) to control activation of a load element PTC thermistor 520. The system 500 includes an outage detection circuit 510 which is operatively connected between the voltage supply 114 and vehicle LED 112. In the illustrated embodiment, the current monitor 514 comprises monitoring inputs 522 and 524, which monitor the current through a sensing resistor 512, and an output 526. One example of an acceptable current switching device is the LT6106 high side current sense amplifier supplied by Linear Technology of Milpitas, Calif. The programmable switching device 515 comprises a control input 528 and a switching output 530. One example of an acceptable programmable switching device is the ATtiny25 microprocessor supplied by Atmel Corporation of San Jose, Calif. The programmable switching device may be programmed to deliver or interrupt current to its output 530 depending on various conditions. The system also includes switching device 518 which is connected in series with a resistor 520. The resistor 520 is sized to produce a current pulse which is larger than the current drawn by the LED 112 as described below. In the illustrated embodiment, the switching device 518 is an n-channel metal oxide field effect transistor (MOSFET) having control input 542 (gate), switching input 544 (drain) and switching output 550 (source).

When the LED 112 is functioning properly, there may be current flowing through resistor 512, which may be detected by the current sensing device 514. The current sensing device 514 may direct current to output 526 and input 528 to signal the switching device 515 that current is flowing through resistor 512 and LED 112. The switching device is accordingly configured to prevent current from flowing to the control input of switching device 518. This may keep switching device 518 turned off and prevent current flow through the resistor 520. However, when the LED 112 fails open, the current sensing device 514 may increase the current from its output 526 to the input 528 of the programmable switching device 515. The programmable switching device 515 may in turn direct current to its output 530 and further to the control input 542 of the switching device 542. This may turn on switching device 518 and allow current to flow through the resistor 520, and through switching input 544 and switching output 550 to ground 116. Due to the size of resistor 520, the additional current drawn by resistor 520 from the supply 114 may be high enough to be detected by additional sensing circuitry in the vehicle. The programmable switching device may be on configured to interrupt current to the control input 542 after a predetermined time, to limit unnecessary current drawn once the pulse has been produced. Because the switching device 515 is programmable using software or machine readable code, the circuit can be configured for multiple system implementations without the need to replace resistors or other component value. Resistors 552, 527, 529, and 531 can be chosen as needed to configure the currents and/or voltages provided to the components of this circuit. Schottky diode 554 can be optionally included to protect against ground plane disturbances such as errant voltages being present on the ground plane or "ground bounce".

The outage detection circuits 110, 210, 310, 410 can further be subdivided into two or more other circuits. As an example, a detection circuit can be selected. The detection circuit can encompass the components of the circuit that enable detection of the failure of the LED. An control circuit can also be defined. The control circuit can encompass the components that cause increased power draw from the power supply.

Optionally, two or more distinctive current signatures may be generated by outage detection circuits 110, 210, 310, and/or 410, with different signatures pertaining to different lamp locations. In this way, the system may differentiate between failures of various lamps in the system and convey that information to the truck cabin giving them more specific information as to which lamp or lamps have failed.

The voltage signatures can take the form of multiple current pulses that can be enabled, for example, by selectively switching load elements of outage detection circuits between the power supply and respective ground reference. Alternatively, multiple load elements can be used to vary the intensity of the current signature. Using these methods, different distinctive current signatures can be generated that very in amplitude, duration, or both. One specific example would be using a single pulse to denote outage of an LED at one location and a double pulse to denote the failure of an LED at another location. A microprocessor can be included in the outage detection circuit to effectuate the generation of these pulses.

Figure 10:
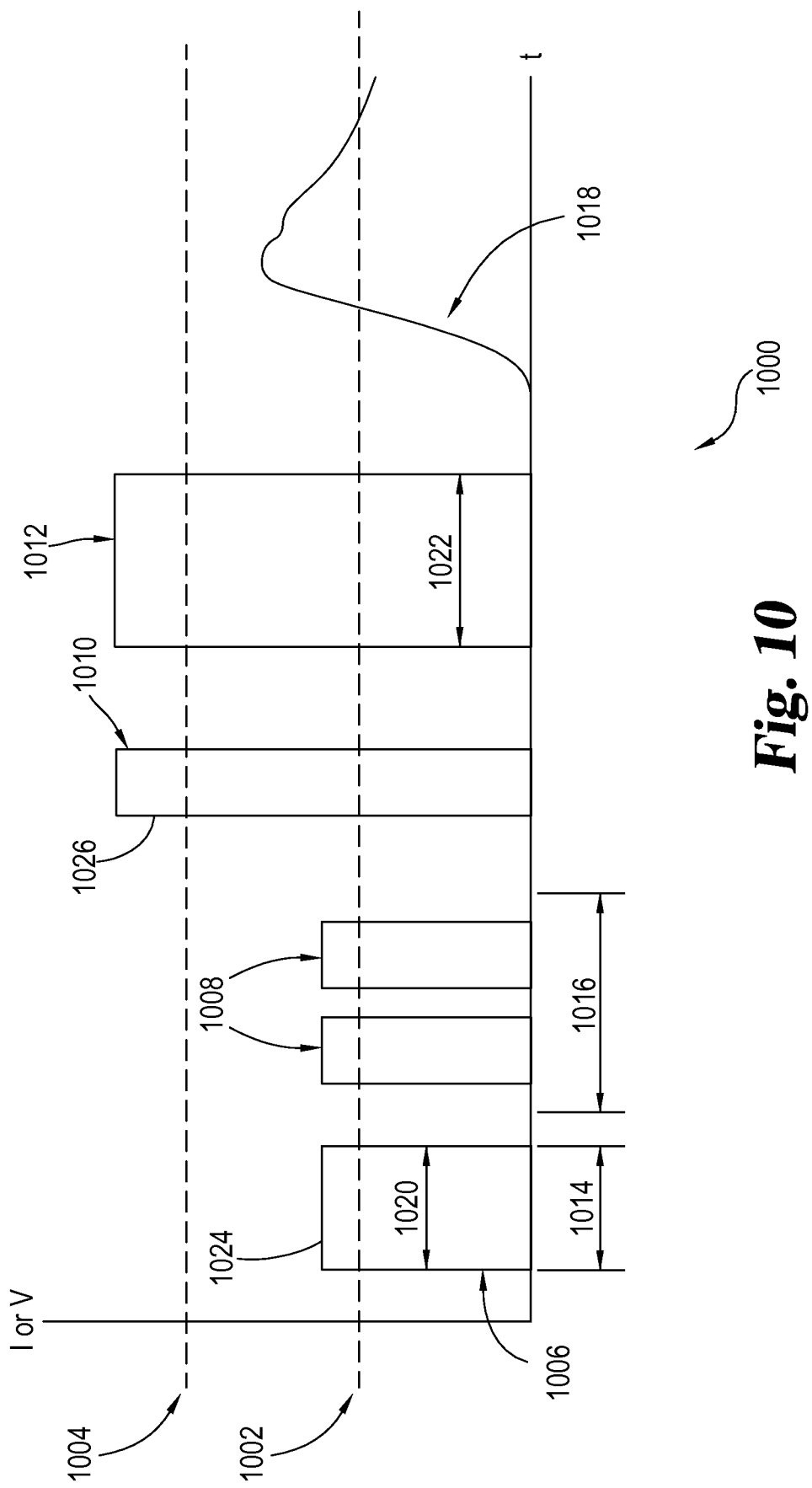
FIG. 10 is a chart illustrating example waveforms for error reporting from the circuits of FIGS. 1-5

FIG. 10 illustrates example distinctive electrical signatures that can be associated with different LED locations. Illustrated is a graph 1000. On the horizontal axis of the graph, time t is denoted. The vertical axis can pertain to current or a corresponding voltage. The waveforms can generally be considered to represent the electrical current passing through an LED being monitored by an outage detection circuit. A default waveform 1006 is illustrated as an example standard output waveform that can be output be the outage detection circuits 110, 210, 310, or 410. It should be evident that the waveform is an idealized example to better illustrate the differences between possible output waveforms. The actual waveform output by the outage detection circuits can vary significantly. For example, the waveform output by the outage detection circuits as disclosed may not resemble a square pulse. Instead, it can take the form of a hill with gradually changing transitions. Alternatively, the output waveform does not have to return to a zero current state (for example, returning to the horizontal axis) and can instead indicate continued non-zero current conduction. Such an example waveform is illustrated as 1018.

The default waveform 1006 is illustrated showing a specific amplitude 1024, width 1020 occurring over a time period 1014. Waveform 1006 may appear as a continuous current for a non-flashing lamp. A second example waveform 1008 is illustrated where two of the default waveforms 1006 occur within a specified time period 1016. The time periods 1014 and 1016 with corresponding waveforms 1006 and 1008 can be compared by a fault detection circuit to differentiate the two waveforms. Such a method could allow a system to detect a flashing lamp, such as a hazard or turn signal flashing mode.

A third example waveform 1010 is illustrated. The amplitude 1026 of the third example waveform 1010 differs from the amplitude 1024 of the default example waveform 1006. The difference in amplitude can be used to differentiate the waveforms. In other words, the fault detection circuit may be configured to detect a pulse over threshold 1004 as a lamp failure. A fourth example waveform 1012 is illustrated having the same amplitude 1026 as the third waveform 1006 but of a longer duration. The third example waveform 2014 may have a different duration 1022 than the default waveform 1006 and can be used to differentiate the two waveforms.

The waveform or current signature can optionally be separately configured for each LED lamp thus configuring different waveforms corresponding to different lamps in the trailer lighting system. For example, a rear right turn signal can be manufactured and marketed that generates a unique failure signature. Alternatively, the LED lamps can have a switch, such as a Dual Inline Package (DIP) switch, to set their installation location and therefore the corresponding specific error signature that can be output. Alternatively, the LED lamps can be programmed before or after they are installed, such as wirelessly or through a CAN Bus or other multiplex port. As a further example, the outage detection circuit can receive programming information pertaining to its installed location after it is installed into a truck or trailer from a wireless or wired device.

FIG. 10 also illustrates a lower bound 1002 and an upper bound 1004 on the vertical axis. These bounds represent example minimum and maximum current draws for a circuit including a power supply, one or more LED lamps, and referenced ground. The selection of these bounds can be chosen to avoid false positives and also to avoid overcurrent conditions within the system. As an example, a standard seven-wire truck interconnection socket may include dedicated signals for the running, right turn, left turn, and backup lights respectively. Each of these signals/circuits can contain multiple lamps in parallel. The lamps can be LED lamps, incandescent lamps, or a combination. For example, a failed LED lamp may be replaced with an incandescent lamp or vice versa.

LED lamps are more commonly being used, in part, because they generally require less power to effectively generate the same amount of light compared to an incandescent bulb. It is advantageous that the current drawn from the power supply of a lamp circuit by an outage detection circuit when a lamp failure is detected be chosen such that the current draw is greater than the current draw of a nominally operational incandescent bulb lamp (or multiple such lamps on the same circuit). In this manner, false positive fault reporting can be avoided from the use of incandescent bulbs in the lamp circuit. It has been found that a four amp minimum power draw by the outage detection circuit is a sufficient value to avoid false positives within the circuit and allow the use of incandescent bulbs.

The maximum current that can be drawn from the lamp circuit can be dictated by the wire size used in the circuit. Typically, new truck and trailer installations use 18 gauge wire. This size wire can be rated to safely carry seven amps of current when the wire is made of aluminum. Greater amperage draw may result in inadvertent fuse failure or damage to the wiring.

Figure 6:
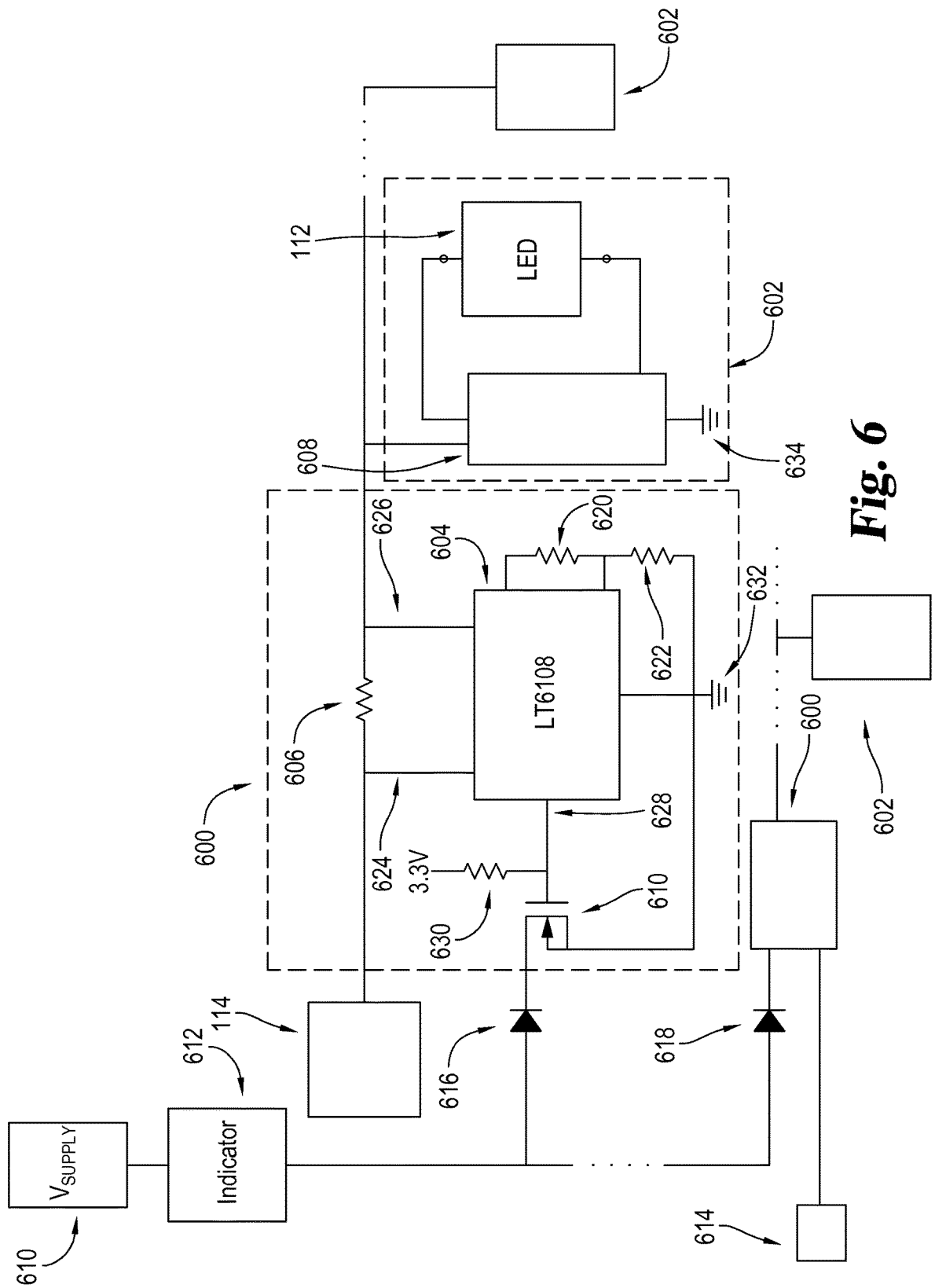
FIG. 6 is an electrical schematic diagram of a fault detection circuit for a vehicle lamp configured for use with the outage detection circuits like those in FIG. 1-5.

FIG. 6 illustrates a fault detection circuit 600 for communicating a fault using an outage detection circuit 608, such as the previously disclosed (110, 210, 310, 410, and 510) circuits. A power supply 610 may power an indicator 612 configured to detect when a fault has been detected. Each LED circuit 602 can include an outage detection circuit 608 and one or more LEDs 112. One or more LED circuits 602 can be used with the fault detection circuit 600. FIG. 6 illustrates two such circuits 602, however any suitable number of circuits 602 can be used.

Fault detection circuit 600 can comprise of a high side current sense amplifier and comparator 604. A Linear Technologies LT6108 is an example of such a device. A power supply 114 can be used to supply power to the outage detection circuits. As illustrated, the power to the LED circuit 602 flows through a resistor 606, that may be characterized as a sense resistor. The amplifier and comparator 604 may use two inputs 624 and 626 to measure the voltage drop across the resistor 606. A set point can be configured via selection of resistors 620 and 622 such that when the amplifier and comparator 604 detects a certain amount of current flowing through resistor 606, the amplifier and comparator 604 activates an open collector output 628. Open collector output 628 can be electrically connected to the gate of an NPN MOSFET 610 and forward biasing the MOSFET 610. In this manner, current can flow from the power supply 610, through the indicator 612, through the diode 616, and through the MOSFET 610. Resistor 630 can be included to limit the amount of current passing through the output 628. Other switching circuits known in the art can alternatively be used.

Multiple fault detection circuits 600 can be used. In this example, diodes 616 and 618 allows two fault detection circuits 600 to enable the same indicator 612. However any suitable number of fault detection circuits 600 can be used with the addition of corresponding diodes like 616 and 618. In another example, each fault detection circuit 600 can use a dedicated indicator. In any of the examples disclosed above, each system 600 can include a dedicated power supply 114, 614 or all systems 600 can share a power supply. Advantageously, for the fault detection system disclosed, the ground reference 634 for power supply 114 can also be isolated from the ground reference 632 for the fault detection circuit 600.

In another example, the fault detection circuit 600 can include the additional feature of activating only the fault indicator 612 when a specific power profile is detected, for example, when a PTC thermistor is used as a load element in the outage detection circuit. Such a circuit could include, for example, a microprocessor in place of the amplifier and comparator 604. Alternatively, multiple amplifier and comparators (or other devices) can be set at different values so that they can latch in a cascade fashion to detect a higher power draw and then the lower, equilibrium power draw.

Figure 7:
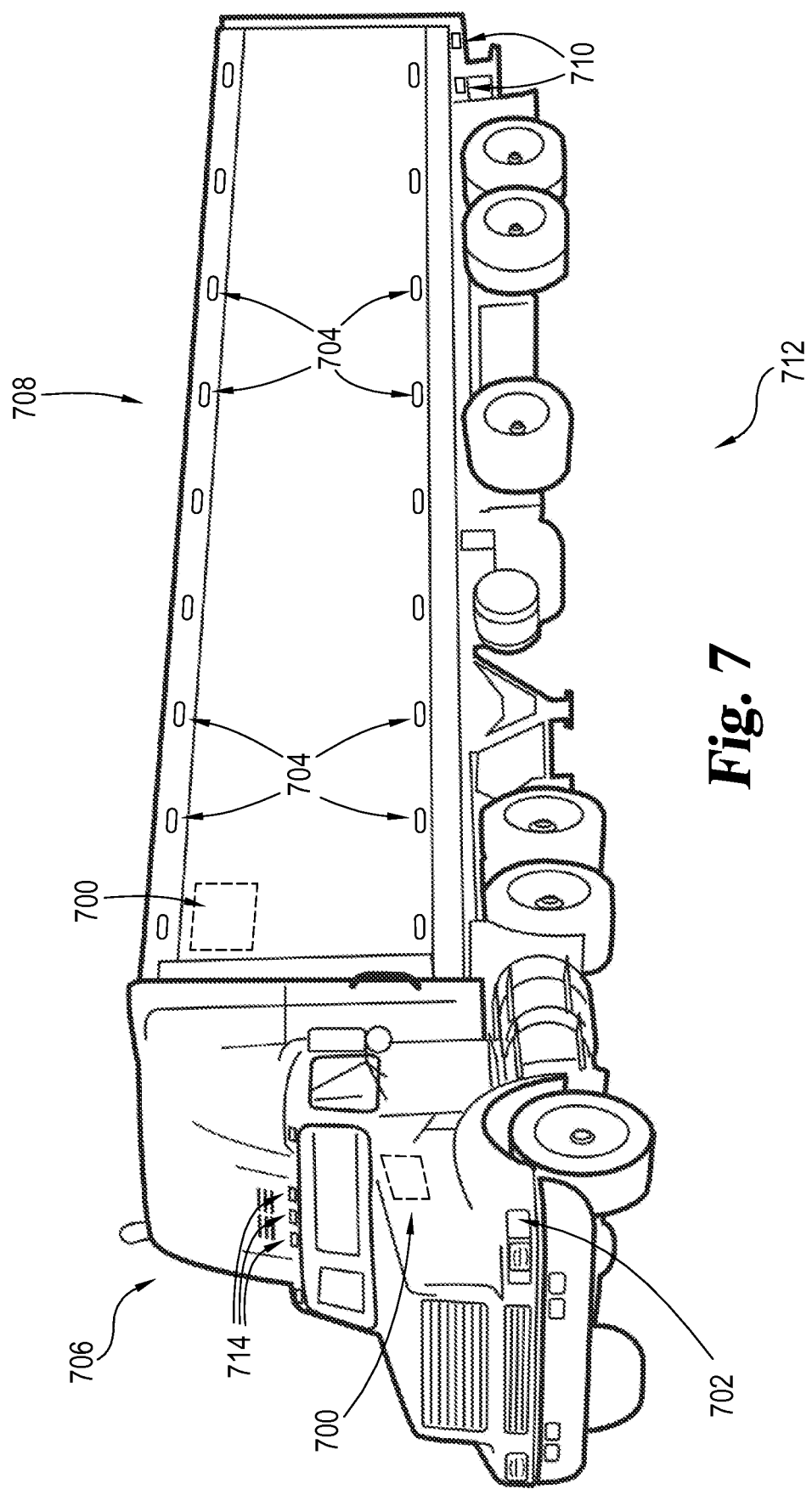
FIG. 7 is a perspective view of a semi-trailer and truck illustrating one example of a trailer and tractor with the circuits of FIGS. 1-6 installed.

FIG. 7 illustrates example implementations of the circuits described herein. In this example, a circuit for detecting and communicating fault(s) in the LED lighting 700 is located in the cabin 706 of a semi-trailer truck 712. This fault detecting and reporting circuit 700 can include any of the circuits disclosed herein. Alternatively, a fault detecting and reporting circuit 700 can be mounted on the trailer 708 of the truck 712. If located on the trailer 708, an indicator can be positioned and then illuminated when a fault is detected to be visible by the operator using a rear view mirror.

LED lights or strings of lights electrically connected in series, parallel, or in any suitable combination thereof, can be associated with one or more outage detecting circuits (such as 110, 210, 310, 410, or 510). For example, the turn signs 702 on the cabin 706 of the truck can use a fault detection circuit. Alternatively, other lights 714 on the cabin 706 can be electrically connected to any of the disclosed outage detection circuits disclosed herein. These lights may be used such as for running lights, indicator lights, brake lights and the like. The trailer 708 can also have running lights 704 and brake lights 710 electrically connected to outage detecting circuit(s) as disclosed herein. These trailer fault detection circuits can be electrically connected to the fault detecting and reporting circuit 700 so that LED failures can be communicated to the operator. The fault detecting and reporting circuit(s) may use different power supplies and/or ground references than the circuits used to power the lights. For example, the trailer 708 may have an independent power supply to power its lights and other equipment that is isolated from the power supply of the cabin 706.

The components of circuits 110, 210, 310, 410 or 510 may be included within a single outer casing, such as a vehicle lamp outer casing. Alternatively, certain components may be located in separate outer casings or in an intermediary outer casing between the lamp outer casing and the vehicle.

Figure 8:
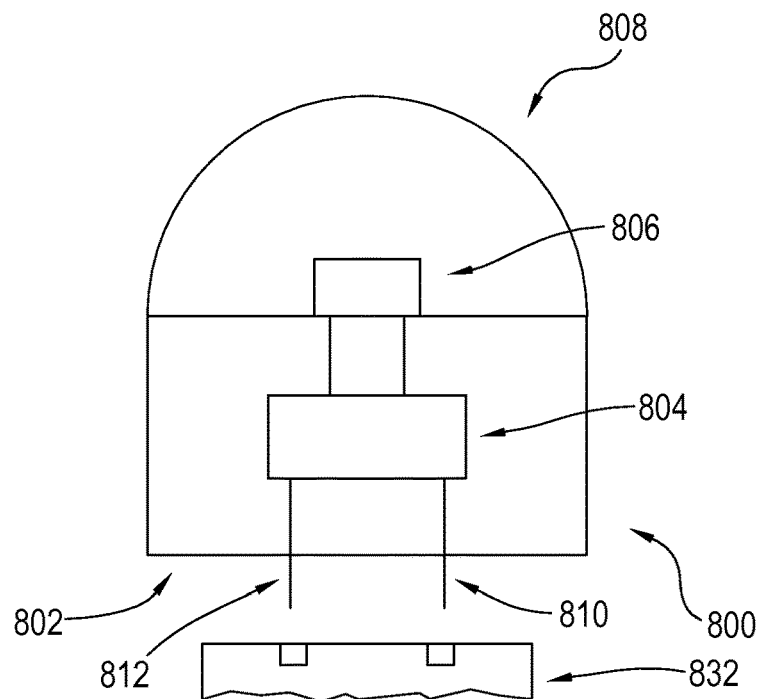
FIG. 8 is a schematic view illustrating another example of the circuits of FIGS. 1-5 mounted in conjunction with an LED lamp.

FIG. 8 illustrates an exemplary mount for the outage detection circuits disclosed herein elsewhere. One illustration shows an LED device 800 including an outage detection circuit 804 in a vehicle lamp outer casing 802. The circuit 804 can be any suitable detection circuit, including, but not limited to, one of circuits 110, 210, 310, 410, 510, and the like. The outer casing 802 may include an optional lens 808 for the LED 806. Terminals 810 and 812 may be included and configured to electrically power the outage detection circuit 804 and the LED 806. This configuration enables the LED device 800 to be used in place of traditional lamps and can be inserted into terminals configured to electrically connect the LED device to the terminal. These terminals 832 can be preexisting on vehicles, for example. Alternatively, a single LED device 800 can be used with multiple traditional LED or other lighting devices that may or may not include an outage detection circuit 804. The LED device 800 can also contain multiple LEDs 806 that can collectively be used with a singular outage detection circuit 804.

Figure 9:
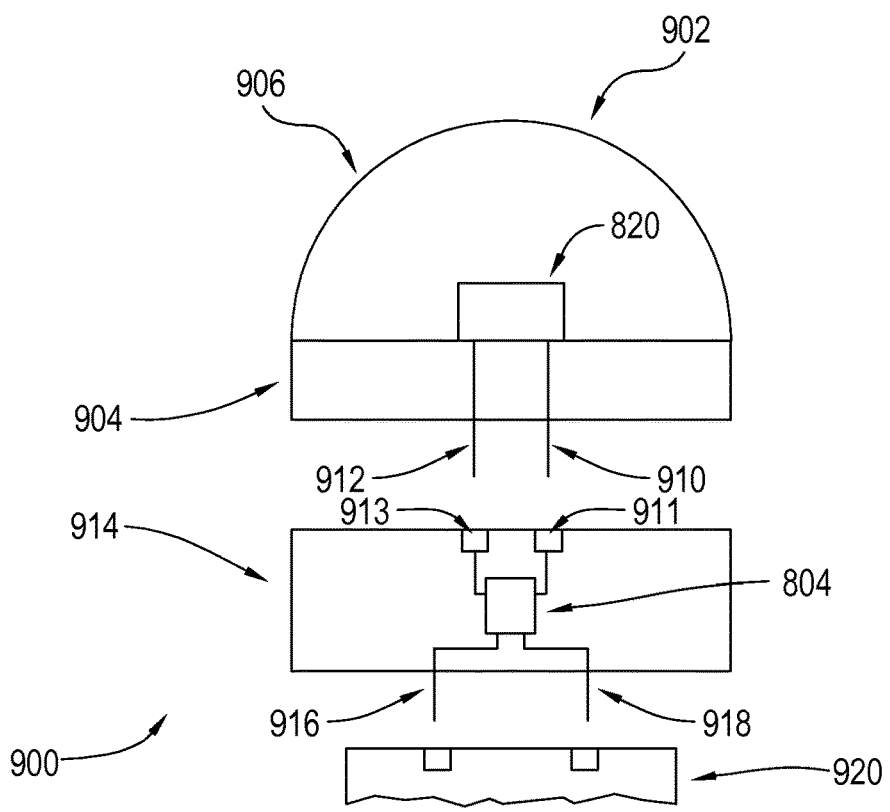
FIG. 9 is a schematic view illustrating another example of the circuits of FIGS. 1-5 mounted in an outer casing.

FIG. 9 illustrates an alternate intermediate outer casing illustration 900 is also included. In this example, a traditional LED lamp package 902 is included that has its own body portion 904, lens 906, LED 908, terminal 910, and terminal 912. The outage detection circuit 804 may be mounted within an intermediary enclosure 914. The intermediary enclosure 914 can include terminal 913 configured to electrically connect with terminal 912 of the LED 908. The intermediary enclosure 914 can also include terminal 911 configured to electrically connect with terminal 910 of the LED 908. The terminals 911 and 913 can, for example, be sockets corresponding to the terminal leads of the LED. The intermediary enclosure 914 can include a cathode terminal 916 and anode terminal 918 of its own. Advantageously, this anode 916 and cathode 918 can be substantially similar to the LED anode 912 and cathode 910, such that the intermediary enclosure 914 can be used between an LED lamp 902 and an existing socket 920 configured to accept the LED lamp 902. The anode 916 and cathode 918 of the intermediary enclosure 914 can also be of a different configuration than the LED anode 912 and cathode 910 to adapt a socket for use with an LED package that is not configured to be inserted directly into the socket.

Figure 11:
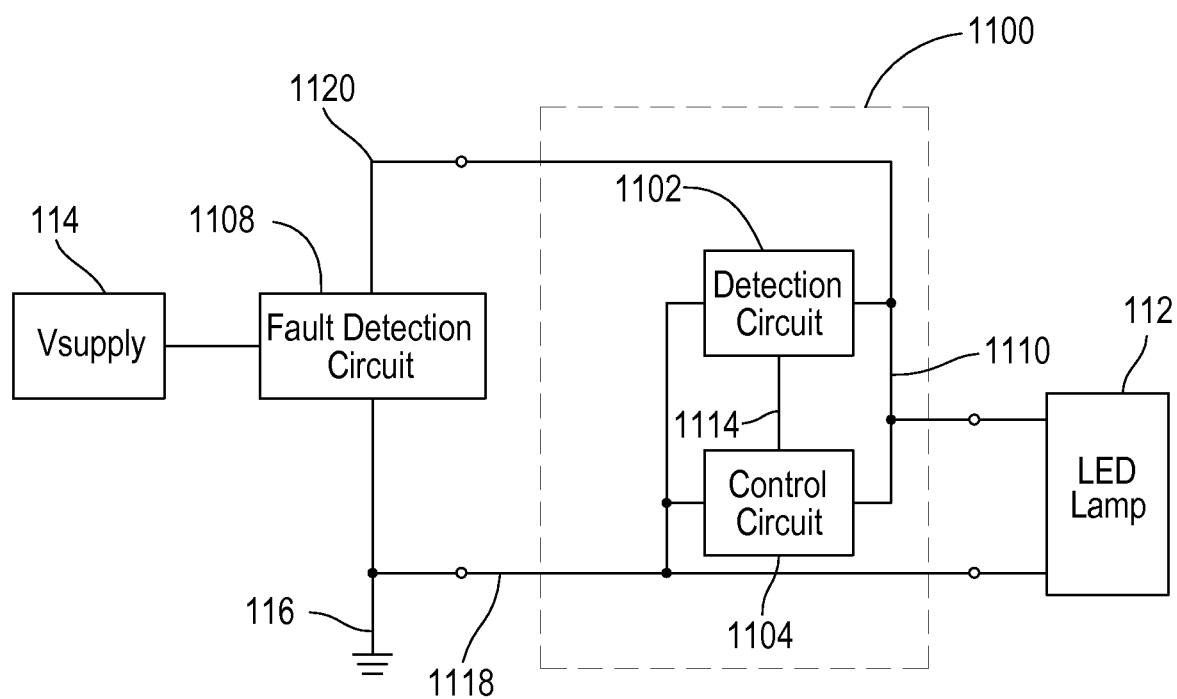
FIG. 11 is a block diagram illustrating an alternate configuration using outage detection circuits like those of the preceding figures connected with a fault detection circuit.

FIG. 11 illustrates a block diagram of an example system 1100 that uses circuits like the circuits described herein. A power supply 1120 can be used to supply power to the various individual circuits through positive electrical connection 1110. Power supply 1120 may optionally be provided via a fault detection circuit 1108. Fault detection circuit 1108 may receive power from power supply 114. The LED lamp 112, can receive power via the positive interconnection 1110, and may be grounded via negative interconnection 1118.

An outage detection circuit 1102 is illustrated as also being coupled to positive interconnection 1110. The detection circuit 1102 can detect outages in LED lamp 112 by any suitable means such as electrically, thermally, physically, via transmitted light, and/or according to any of the examples illustrated and discussed herein elsewhere. Detection circuit 1102 may be coupled to a control circuit 1104 at 1114. When LED lamp 112 fails, detection circuit 1102 can signal control circuit 1104 to generate a change in current detectable by fault detection circuit 1108.

The term "anode" here means the positively charged electrode by which the electrons leave a device.

The term "base" here means the control terminal of a bipolar junction transistor that controls the conductivity of the channel between the collector and emitter.

The term "cathode" here means the negatively charged electrode by which electrons enter an electrical device.

The term "collector" here means the terminal of a bipolar junction transistor into which a switched current enters when the transistor is forward biased.

The term "control input" here means an input terminal of a device where the signal received at the terminal determines the functionality of the device. Some examples include the base of an NPN bipolar junction transistor and the gate of a MOSFET transistor.

The term "diode" here means a two terminal electrical device which allows current to flow in one direction, but prevents current from flowing in the opposite direction. Examples include p-n silicon junction diodes, light emitting diodes, Schottky diodes, and Zener diodes, to name a few.

The term "drain" here means the terminal of a field effect transistor out of which a switched current leaves the transistor when the transistor is forward biased.

The term "emitter" here means the terminal of a bipolar junction transistor out of which a switched current leaves the transistor when the transistor is forward biased.

The term "fail open" here means to stop conducting current due to an internal component failure.

The term "FMVSS 108 compliant" here means, meeting the candela, illuminated surface area and other requirements set forth by U.S. 49 C.F.R. § 571.108.

The term "Illuminated surface area" here means, per 49 C.F.R. § 571.108, the Effective projected luminous lens area (EPLLA), which means the area of the orthogonal projection of the effective light-emitting surface of a lamp on a plane perpendicular to a defined direction relative to the axis of reference. Unless otherwise specified, the direction is coincident with the axis of reference.

The term "fuse" here means a safety device a material that melts and breaks an electric circuit if the current through the material exceeds a specified safe level.

The term "gate" here means the control terminal of a field-effect transistor that controls the conductivity of the channel between the source and drain.

The term "LED" here means light emitting diode, including single diodes as well as arrays of LED's and/or grouped light emitting diodes. This can include the die and/or the LED film or other laminate, LED packages, said packages may include encapsulating material around a die, and the material, typically transparent, may or may not have color tinting and/or may or may not have a colored sub-cover. An LED can be a variety of colors, shapes, sizes and designs, including with or without heat sinking, lenses, or reflectors, built into the package.

The term "LED fault signal" here means a signal that is used to indicate the failure of an LED. The LED fault signal can take the form of power to illuminate a fault LED, a data message (such as via a serial communication protocol or other), a mechanical indicator, or other. The LED fault signal can be used to communicate a failed LED to an onboard computer or display system within a truck cabin.

The term "light" here means light which is visible to the naked human eye.

The term "node" here means an electrical junction between two or more electrical components, wherein the voltage at all physical points within the node is substantially equal.

The term "outer casing" here means a physical outer casing, terminal, insulation or sheath on the outside of a component, exposed to the surrounding environment such as outdoors and/or the inside of a trailer or trailer conduit.

The term "on-board the trailer" here means part of the trailer (inside, outside or both) and not inside a truck.

The term "resistor" here means a device having a resistance to the passage of electrical current.

The term "socket" here means an electrical device receiving light bulb or lamp to make a connection.

The term "source" here means The term "drain" here means the terminal of a field effect transistor into which a switched current enters the transistor when the transistor is forward biased.

The terms "stop-tail-turn" lamp or "STT" here means a lamp which is compliant with present legal and/or regulatory requirements in this country such as illuminated surface area, candela, and otherwise.

The term "switching device" here means a device which is capable of dynamically allowing or interrupting current flow.

The term "terminal" here means a plug, socket or other connection (male, female, mixed, hermaphroditic, or otherwise) for mechanically and electrically connecting two or more wires or other conductors.

The term "truck" here means a powered truck (also known as a tractor or cab) for pulling a trailer.

The term "vehicle" here means a self-propelled or towed device for transportation, including without limitation, car, truck, bus, boat, tank or other military vehicle, airplane, truck trailer, truck cab, boat trailer, other trailer, emergency vehicle, and motorcycle.

Articles and phases such as, "the", "a", "an", "at least one", and "a first", are not limited to mean only one, but rather are inclusive and open ended to also include, optionally, two or more of such elements. In terms of the meaning of words herein, literally different elements or words in dependent claims are not superfluous, and have different meaning and are not to be imported or implied or synonymous with elements or words in the claims from which they depend.

The language used in the claims and the written description and in the above definitions is to only have its plain and ordinary meaning, except for terms explicitly defined above. Such plain and ordinary meaning is defined here as inclusive of all consistent dictionary definitions from the most recently published (on the filing date of this document) general purpose Webster's dictionaries and Random House dictionaries.

While the invention has been illustrated and described in detail in the drawings and foregoing description, the same is to be considered as illustrative and not restrictive in character, it being understood that only the preferred embodiment has been shown and described and that all changes, equivalents, and modifications that come within the spirit of the inventions defined by following claims are desired to be protected. All publications, patents, and patent applications cited in this specification are herein incorporated by reference as if each individual publication, patent, or patent application were specifically and individually indicated to be incorporated by reference and set forth in its entirety herein.

The invention claimed is:

1. An outage detection circuit, comprising:
    an LED electrically connected between a power supply and a ground reference;
    a detection circuit adapted to detect outage of the LED, the detection circuit including a load element separate from the LED that is electrically coupled between the power supply and the ground reference; and
    an increase circuit responsive to one or more electrical variances of the detection circuit, the increase circuit adapted to:
        induce increased electrical current flowing between the load element and the ground reference;
        induce increased electrical current flowing between the load element and the power supply; or both,
    wherein the increase circuit is configured to automatically induce said increasing of current flow when said detection circuit detects a failure in the LED.

2. The circuit of claim 1, wherein said LED is illuminated using power from said power supply.

3. The circuit of claim 2, wherein the current used to power said LED and said circuit for detecting outage of an LED flows between said power supply and said ground reference.

4. The circuit of claim 1, wherein said increase circuit comprises said load element.

5. The circuit of claim 1, wherein said increase circuit induces an increased electrical current flow of at least four amps.

6. The circuit of claim 5, wherein said increase circuit induces an increased electrical current flow of less than seven amps.

7. The circuit of claim 1 wherein said load element is a positive temperature coefficient (PTC) thermistor.

8. The circuit of claim 3 wherein the detection circuit is configured to detect decreased power consumption by the LED.

9. The circuit of claim 1 wherein the detection circuit is configured to monitor the current draw of the LED, a voltage across the LED, a voltage in series with the lamp, or a voltage in parallel with the lamp.

10. The circuit of claim 1 wherein the circuit for detecting outage of an LED and the LED are housed in an enclosure.

11. The circuit of claim 1, further comprising:
    a socket configured to retain the LED, the socket having electrical terminals configured to electrically connect to the LED; and
    an outer casing configured to retain the LED, the outer casing having electrical terminals configured to electrically connect to the LED and socket terminals;
    wherein the circuit for detecting outage of an LED is mounted in the outer casing.

12. An outage detection circuit, comprising:
    an LED electrically connected between a power supply and a ground reference, wherein the LED is powered by current flowing between said power supply and said ground reference;
    means for detecting outage of the LED that includes a load element separate from the LED that is electrically coupled between the power supply and the ground reference;

means for increasing current flowing between said power supply and said ground reference automatically in response to detection of said outage of the LED.

13. The circuit of claim 12 wherein said increased current flow is substantially larger than the nominal current flow induced by powering said LED.

14. The circuit of claim 12 wherein the current flow changes after the detection of a fault in the LED lamp from a first flow rate at a first time to a second flow rate at a second time, wherein the first flow rate is greater than the second flow rate and wherein the power supply voltage at the first time is substantially equal to the power supply voltage at the second time.

15. The circuit of claim 12 wherein the detection circuit comprises a Bipolar Junction Transistor (BJT).

16. The circuit of claim 15 wherein the base of the BJT is electrically connected to an anode of the LED lamp and the detection circuit is configured such that current passes from the anode to the base of the BJT.

17. The circuit of claim 1, further comprising:
a fault detection circuit electrically coupled to the load element and responsive to an LED fault signal, the fault detection circuit configured to detect the increased current flow caused by the increase circuit and automatically activate the LED fault signal in response to the increased current flow.

18. The circuit of claim 17, wherein the fault detection circuit is mounted to a truck, the truck configured for use with a trailer.

19. The circuit of claim 18, wherein the detection circuit, load element, LED, and increase circuit are mounted to a trailer.

20. The circuit of claim 17, further comprising a second load element, a second LED, a second detection circuit, and a second increase circuit;
wherein the second increase circuit, second load element, or a combination of the two is adapted to induce an increased current flow having a substantially different waveform than the circuit of claim 1.

21. The circuit of claim 20, wherein the fault detection circuit is further adapted to differentiate between the two waveforms generated by the different increase circuit/load element combinations and activate two different LED fault signals accordingly.

* * * * *